United States Patent [19]

Futamoto et al.

[11] Patent Number: 4,467,240

[45] Date of Patent: Aug. 21, 1984

[54] ION BEAM SOURCE

[75] Inventors: Masaaki Futamoto, Kanagawa; Isamu Yuito, Ome; Ushio Kawabe, Tokyo, all of Japan

[73] Assignee: Hitachi, Ltd., Tokyo, Japan

[21] Appl. No.: 344,186

[22] Filed: Jan. 28, 1982

[30] Foreign Application Priority Data

Feb. 9, 1981 [JP] Japan .................. 56-17011

[51] Int. Cl.³ .......................... H01J 1/16; H01J 19/10
[52] U.S. Cl. ..................................... 313/336; 313/630
[58] Field of Search ........................ 313/336, 630, 633

[56] References Cited

U.S. PATENT DOCUMENTS

| | | | |
|---|---|---|---|
| 3,775,630 | 11/1973 | Minamikawa et al. | 313/336 |
| 4,055,780 | 10/1977 | Kawai et al. | 313/336 |
| 4,143,292 | 3/1979 | Hosoki et al. | 313/336 |
| 4,193,013 | 3/1980 | Futamoto et al. | 313/336 |
| 4,346,325 | 8/1982 | Nakasuji et al. | 313/336 |

Primary Examiner—David K. Moore
Assistant Examiner—Robert E. Wise
Attorney, Agent, or Firm—Antonelli, Terry & Wands

[57] ABSTRACT

An ion beam source characterized in that a needle-like tip is comprised of a carbide, a nitride, or a diboride of at least one element selected from the group consisting of Ti, Zr, Hf, V, Nb and Ta, a hexaboride of at least one element of rare earth metal elements of atomic numbers 57–70, or carbon. Stable ion beam emission of high brightness and long life can be obtained by using the needle-like tip of the said material.

16 Claims, 4 Drawing Figures

ION BEAM SOURCE

BACKGROUND OF THE INVENTION

This invention relates to an ion beam source, and more particularly to a point ion beam source.

The performance of ion beam application apparatuses or systems such as an ion beam micro-analyzer, an ion beam lithography system for drawing a semiconductor circuit, etc. greatly depends upon the capacity of ion beam source. The ion beam source used in these apparatuses or systems is a point ion beam source that emits a narrow beam. The necessary conditions for the point ion beam source are that a stable ion beam having a high brightness be emitted for a prolonged duration.

Ion species include ions of metal such as gallium (Ga), indium (In), bismuth (Bi), gold (Au), lead (Pb), iron (Fe), cobalt (Co), nickel (Ni), etc., ions of metalloid and semiconductor elements such as boron (B), phosphorus (P), arsenic (As), antimony (Sb), silicon (Si), etc.; ions of gases such as hydrogen ($H_2$), helium (He), neon (Ne), argon (Ar), krypton (Kr), xenon (Xe), nitrogen ($N_2$), oxygen ($O_2$), water ($H_2O$), methane ($CH_4$), etc.

To produce ions of the said species, it is necessary to apply a high positive electric field to a needle-like tip, and supply a liquid metal of Ga, In, or the like, or a gas of $H_2$, He, Ar, $O_2$, or the like to the tip to ionize it under the action of electric field. However, among the metalloid and semiconductor elements, B and Si have a high melting point and P, As and Sb have a very high vapor pressure in a liquid state. Thus, to obtain ions of these elements, a liquid alloy is usually used. For example, an alloy consisting of 45% by weight of B and 55% by weight of Ni has a melting point of about 1,000° C. and also has a low vapor pressure. When the alloy is ionized, B ions and Ni ions can be obtained, and only B ions can be isolated through a magnetic field.

To obtain B ions, alloys of B—Pt, B—Ni—Pt, etc. are available in addition to the alloy of B—Ni. To obtain ions of Si, P, As, and Sb, alloys of Si—Au, P—Ni, As—Ni, As—Pt, and Sb—Au are available. The alloy systems are, however, not limited to the above-mentioned ones, and alloys of any combination are available in principle, so long as the combination has a lower melting point and a low vapor pressure, when alloyed.

In the case of a liquid metal including a liquid alloy, such a procedure is used that a liquid metal supply source is provided at the bottom of a needle-like tip and the liquid metal is diffused on the tip surface along the axis of tip to supply the liquid metal to the end of the tip from which ions are emitted.

In the case of a gas, such a procedure is usually used that a gas is introduced into a chamber encasing a needle-like tip to supply the gas to the tip. To obtain a gas ion beam having a high brightness, such a procedure is used that the needle-like tip is cooled to less than the liquefaction temperature of the gas to condense it on the tip surface and diffuse the tip surface on the same principle as in the case of the liquid metal, thereby supplying the condensed gas molecules to the end of the tip followed by ionization.

Requirements for the needle-like tip that ionizes a liquid metal or a gas in the foregoing manner are that (1) it withstands a high electric field, (2) it is not eroded by a liquid metal or gas molecules to be ionized, (3) it is wetted by a liquid metal or gas molecules to some extent, (4) it undergoes efficient ionization at the tip, and (5) it is electro-conductive. In addition, practical requirements are that it can be readily processed into a needle-like tip, and also can be readily handled.

The needle-like tip so far used is restricted to tips of refractory metals such as tungsten (W) and molybdenum (Mo). Particularly, needle-like tip of W has been used as a practical point ion beam source, because W has the highest melting point among the metals, the highest strength under the working conditions of electric field, and a good processability.

However, the ionization of gases, particularly, $H_2$, He, Ar, Kr, Xe, $O_2$, etc. suffers from such problems that the strength of W against the electric field is not high enough, and the shape of needle-like tip is deformed as a result of reaction of W with an active gas such as $H_2$, $O_2$, etc. To improve the life of ion beam source and the stability of emitted ion beam, it is necessary to use a needle-like tip having a higher strength against the electric field and a less reactivity particularly with an active gas than W.

SUMMARY OF THE INVENTION

An object of the present invention is to provide an ion beam source of long life capable of emitting a stable ion beam having a high brightness.

The said and other objects of the present invention can be attained by an ion beam source comprising an ionization chamber, a needle-like tip disposed in the ionization chamber, a support for the needle-like tip, a supply source for a substance to be ionized, and a cathode, characterized in that the needle-like tip is comprised of a carbide, a nitride, or a diboride of at least one element selected from the group consisting of Ti, Zr, Hf, V, Nb and Ta, a hexaboride of at least one element of rare earth metal elements of atomic numbers 57–70, or carbon.

DETAILED DESCRIPTION OF PREFERRED EMBODIMENTS

Figure 1:
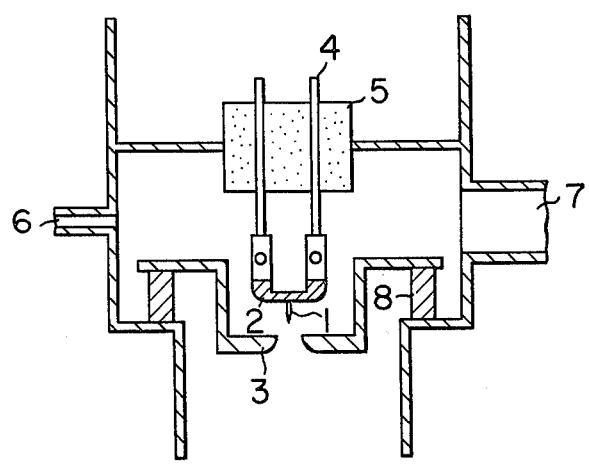
FIG. 1 is a cross-sectional side view of one embodiment of the point ion beam source according to the present invention.

The needle-like tip for the present ion source comprises a carbide, a nitride, or a diboride of metals of the groups IV and V (Ti, Zr, Hf, V, Nb and Ta), each including a mixed crystal of at least two of the said metal elements, a hexaboride of rare earth metal elements of atomic number 57–70, or carbon.

That is, the materials for the needle-like tip include TiC, ZrC, HfC, VC, NbC, TaC and their mixed crystals; TiN, ZrN, HfN, VN, NbN, TaN and their mixed crystals; $TiB_2$, $ZrB_2$, $HfB_2$, $VB_2$, $NbB_2$, $TaB_2$ and their mixed crystals; $LaB_6$, $CeB_6$, $PrB_6$, $NdB_6$, $SmB_6$, $EuB_6$; glassy carbon, polyacrylonitrile-carbonized carbon, etc.

In the foregoing, the carbides and nitrides, where ratio of C or N to the metal element M is 1:1, where M represents at least one element selected from the group consisting of Ti, Zr, Hf, V, Nb and Ta, are exemplified, but the carbides and the nitrides are not restricted to the said ratio. That is, those having a ratio of C/M or N/M in a range of 0.5–2 can be also used. For example, those having such compositions as $TiC_{0.8}$ and $ZrC_{0.9}$ can be used. However, it is preferable to use chemically stable compounds having a ratio of C/M or N/M of substantially 1.0.

It is more preferable to use the carbides or nitrides in the crystalline form of sodium chloride type owing to ready preparation, stability, etc.

It is more preferable to use single crystal whisker for the said carbides and the nitrides for the following reasons. Particularly, it is more preferable to use single crystal whisker having the <111> or <110> orientation.

It is likewise preferable to use single crystal whisker for the diborides and more preferable to use single crystal whisker particularly having the <100> orientation.

As the hexaborides of rare earth metal elements, it is preferable to use a hexaboride of at least one element selected from the group consisting of La, Ce, Pr, Nd, Sm and Eu, and more preferable to use single crystal of <100> orientation.

All the above-mentioned materials and carbon have a high melting point such as 2,500° C. or higher, a high mechanical strength, and a good electrical conductivity, and further have a less interaction with a gas such as $H_2$, He, Ar, $O_2$, etc., and a less susceptibility to erosion by a liquid metal such as Ga, In, Bi, Au, Pb, etc., or a liquid alloy such as B—Pt, B—Ni, B—Ni—Pt, Si—Au, P—Ni, P—Ni, As—Ni, As—Pt, Sb—Au, etc.

It is known to use some of these materials as an electron emitter, but the present inventors have found that these materials satisfy various properties required for the needle-like tip for the point ion beam source, as described above, and the present invention has been established on the basis of the said finding to improve the performance of the point ion beam source.

These materials, particularly carbides, nitrides and borides, are refractory materials, and thus it is difficult to produce therefrom a molten mass or single crystal which can be processed into a needle-like tip. Furthermore, these materials are very hard, and even if a good single crystal is produced, it is not easy to process it into a needle-like tip. Such a procedure that a slender bar-like sample can be cut out of a single crystal rod in a bulk state, for example, by electric discharge processing, or the like, and then processed into a needle-like tip by electropolishing is available, but not recommendable. For the point ion beam source, it is desirable to prepare a single crystal material in a slender bar-like form from the beginning. Thus, in Examples of the present invention, single crystal whiskers of carbides, nitrides and diborides made grown by chemical vapor deposition and bar-like hexaboride crystals made grown according to an Al flux procedure were used. It is also possible to prepare tips of carbides, nitrides or borides by carbidizing, nitridizing or borodizing metal tips of Nb, Ta, Hf, etc.

For the point ion beam source, it is particularly desirable to emit an ion beam of high current density in the axial direction of a needle-like tip. The emitting direction of ion beam of high current density particularly depends upon the shape of a tip for gas ion beam, and particularly greatly upon the orientation of crystal, if the tip is a single crystal. For example, in the case of a carbide or a nitride having a crystal structure of NaCl type, the axial direction of a tip emitting a particularly dense ion beam is the <111> and <110> orientations. In the case of a diboride and a hexaboride, a dense ion beam is emitted in the <100> orientation. Thus, it is effective for the production of a point ion beam source to use a needle-like tip having the above-mentioned orientation.

As a metal to be ionized, the said Ga, In, Bi, Au, Pb, Fe, Co, Ni, etc. can be used, and particularly Ga, In, Bi, Au and Pb are preferable. Furthermore, alloys of B—Pb, B—Ni, B—Ni—Pt, Si—Au, P—Ni, As—Ni, As—Pt, Sb—Au, etc. can be used. As a gas to be ionized, the said $H_2$, He, Ne, Ar, Kr, Xe, $N_2$, $O_2$, $H_2O$, $CH_4$, etc. are used, and particularly $H_2$, He, Ne, Ar, Kr, Xe, $N_2$, and $O_2$ are preferable. A gas mixture of at least two of these gaseous species can be used.

The present invention will be described in detail below, referring to Examples.

EXAMPLE 1

The present example relates to point ion beam sources using carbides of metals of groups IV and V.

Whiskers of TiC, ZrC, HfC, VC, NbC and TaC were made to grow by chemical vapor deposition. Graphite was placed as a substrate in an electric furnace heated to 1,300°–1,500° C., and the whisker was made to grow on the substrate by passing any of $TiCl_4$, $ZrCl_4$, $HfCl_4$, $VCl_5$, $NbCl_5$ and $TaCl_5$ together with a gas mixture of $CH_4$ and $H_2$ over the substrate for 2–4 hours. Maximum dimensions for the respective whiskers were 300 $\mu$m in diameter and a few millimeters long for TiC, 30 $\mu$m in diameter and a few millimeters long for ZrC, 40 $\mu$m in diameter and 3 mm long for HfC, 50 $\mu$m in diameter and a few millimeters long for VC, 20 $\mu$m in diameter and a few millimeters long for NbC, and 50 $\mu$m in diameter and 2 mm long for TaC. Three axial orientations <111>, <110> and <100> were observed as the growth direction of whiskers of all the carbides.

The respective carbide whiskers were bonded each to furan resin filaments by an uncured furan resin as an adhesive, and the bonded filaments were heated at 1,500° C. in vacuum to carbonize the resin portions, thereby bonding the carbide whiskers to the carbon filaments. Then, the carbide whiskers were electropolished in an electrolytic solution of hydrofluoric acid-nitric acid system to process them into needle-like tips. Point ion beam sources were prepared from the resulting needle-like tips, as shown in FIG. 1.

Figure 2A:
FIG. 2(A), FIG. 2(B), and FIG. 2(C) are views showing $H_2$ ion images produced by needle-like tip of TiC, respectively.
Figure 2B:
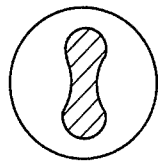
Figure 2C:
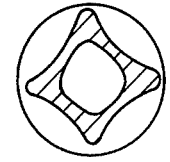

A high potential was applied to between a needle-like tip 1 and a cathode 3 so that the needle-like tip could take a positive charge. When a gas to be ionized was introduced over the tip through a gas inlet 6 under an appropriate pressure ($10^{-2}-10^{-3}$ Torr), a field ionization phenomenon appeared at the tip to emit gas ions. By keeping the temperature of the needle-like tip by 10–20% lower than the gas liquefaction temperature, the current density and the stability of gas ions were effectively increased in that case. FIG. 2(A), FIG. 2(B), and FIG. 2(C) show ion images produced by the hydrogen ions emitted from three TiC whisker tips each having <111>, <110> and <100> axial orientations, respectively. In FIG. 2(A), FIG. 2(B) and FIG. 2(C), hatched portion shows an area occupied by highly dense ion beam emission. It is seen therefrom that a strong ion beam was emitted in the direction of center axis from the needle-like tips each having the <111> and <110> orientations. Similar ion images were observed in the cases of ZrC, HfC, VC, NbC and TaC. The desirable axial orientations of the tips of these carbides as the ion beam source are <111> or <110>.

In FIG. 1, numeral 2 is a carbon filament, numeral 4 an electrode, numeral 5 a ceramic, numeral 7 a vacuum exhaustion opening, and numeral 8 an insulating ceramic.

Table 1 shows comparison of the life of point ion beam sources of these carbides with that of a point ion beam source of the conventional W needle-like tip for various species of generated gas ions. The comparison of the life shows how many times the life is on the basis of the life of the W ion beam source under the identical working conditions of ion beam sources (for example, identical needle-like tip temperature, identical introduced gas pressure, identical electric field intensity, etc.). The life of the point ion beam sources did not depend upon the orientation of the needle-like tips.

As is evident from Table 1, the point ion beam sources of carbides having a longer life than the point ion beam source of the conventional W for any of these gas ion species. Among the tested carbides it was found that HfC had a longer life.

TABLE 1

| ion species | Materials | | | | | | |
|---|---|---|---|---|---|---|---|
| | W | TiC | ZrC | HfC | VC | NbC | TaC |
| $H_2$ | 1.0 | 1.5–2.5 | 2.5–3 | 2–3 | 1.3–2 | 1.8–2.5 | 2–2.8 |
| He | 1.0 | 1.0–1.5 | 1.2–1.4 | 1.2–2.0 | 1.1–1.6 | 1.2–1.5 | 1.4–1.8 |
| Ne | 1.0 | 1.0–1.5 | 1.2–1.3 | 1.3–2.0 | 1.1–1.7 | 1.2–1.4 | 1.4–1.8 |
| Ar | 1.0 | 1.2–1.4 | 1.5–2.5 | 2.0–2.5 | 1.1–1.5 | 1.3–1.7 | 1.3–2.0 |
| $O_2$ | 1.0 | 1.2–2.0 | 1.5–2.5 | 1.5–2.5 | 1.1–1.5 | 1.3–2.0 | 1.5–2.3 |

Then, a droplet of liquid metal Ga was placed at the root of the needle-like tip to investigate its characteristics as a liquid metal ion beam source. That is, wettability of Ga with the carbide needle-like tips, and erosion of the needle-like tips by the liquid metal Ga after working as a liquid metal ion beam source for the predetermined duration were investigated. It is desirable that a needle-like tip for practical point ion beam source has a good wettability and less erosion. Results of tests on the wettability and erosion conducted under the identical conditions are shown in Table 2.

The wettability was determined by evaluating a completely wetted state as 100% and a completely unwetted state as 0%, and the erosion was determined by emitting an ion beam for a predetermined duration under the identical conditions with those of W needle-like tip, removing Ga from the surface of the needle-like tips, measuring an erosion depth on the surface of the tip by a scanning electron microscope, and obtaining a ratio of the measured erosion depth to that of the W needle-like tip.

As is evident from Table 2, the needle-like tips of TiC, ZrC, HfC, VC, NbC, and TaC are equal in the wettability and superior in the erosion resistance to the W needle-like tip. A point ion beam source for liquid Ga of long life can be obtained from the needle-like tips of these carbides.

TABLE 2

| Item | Materials | | | | | | |
|---|---|---|---|---|---|---|---|
| | W | TiC | ZrC | HfC | VC | NbC | TaC |
| Wettability (%) | 100 | 100 | 100 | 100 | 100 | 100 | 100 |
| Erosion | 1.0 | 0.5–0.6 | 0.2–0.4 | 0.2–0.3 | 0.4–0.5 | 0.3–0.4 | 0.2–0.3 |

Other liquid metal species than Ga, i.e. In, Bi, Au, Pb, Fe, Co, Ni, etc. had the similar effect, and particularly Ga, In, Bi, Au and Pb had preferable effects. Furthermore, alloys of 55 Ni-45 B, 70 Pt-30 B, 50 Ni-20 Pt-30 B, 69 Au-31 Si, 81 Ni-19 P, 63 Ni-37 As, 72 Pt-28 As and 33 Au-67 Sb (figures being all by atomic percent) had the similar results.

EXAMPLE 2

The present example relates to point ion beam sources using nitrides of metals of Groups IV and V.

Whiskers of TiN, ZrN, HfN, VN, NbN, and TaN were made to grow by chemical vapor deposition in the same manner as in Example 1 for the growth of carbide whiskers, except that $N_2$ gas was used in place of $CH_4$. The dimensions of the resulting whiskers were all smaller than a half of those of the carbide whiskers. Three orientations $<111>$, $<110>$ and $<100>$ were found in the growth direction of the whiskers.

Point ion beam sources were prepared from the thus obtained nitride whiskers in the same manner as in Example 1.

The hydrogen ion images of the ion beam from the nitride needle-like tips were similar to those from the carbide tips shown in FIG. 2. It was found also in the cases of nitrides that the needle-like tips each having the $<111>$ or $<110>$ orientation emitted a strong ion beam in the axial orientation of the tips.

Table 3 shows comparison of the life of the nitride needle-like tips with that of the conventional W needle-like tip as point ion beam sources for the various gas ion species. It is evident therefrom that the nitride needle-like tips has a longer life as an ion beam source than the conventional W needle-like tip, and the performance of point ion beam source was improved.

TABLE 3

| ion species | Materials | | | | | | |
|---|---|---|---|---|---|---|---|
| | W | TiN | ZrN | HfN | VN | NbN | TaN |
| $H_2$ | 1.0 | 1.5–2.4 | 2.0–2.8 | 2.3–3.2 | 1.3–2.0 | 1.9–2.5 | 2.0–3.1 |
| He | 1.0 | 1.0–1.3 | 1.2–1.8 | 1.3–2.0 | 0.9–1.4 | 1.3–1.7 | 1.7–2.1 |
| $N_2$ | 1.0 | 1.5–2.5 | 1.8–2.7 | 2.0–3.0 | 1.4–2.0 | 1.6–2.3 | 2.0–2.5 |
| Ar | 1.0 | 1.2–1.8 | 1.4–2.3 | 1.8–2.6 | 1.0–1.4 | 1.2–1.7 | 1.4–1.9 |
| O | 1.0 | 1.0–1.5 | 1.5–2.3 | 1.5–2.5 | 1.0–1.3 | 1.3–2.0 | 1.5–2.5 |

Table 4 shows comparison in characteristics of nitride needle-like tips when used as a liquid Ga ion beam source, as determined in the same manner as in Example 1. The nitrides had the similar characteristics to those shown in Table 4 for other liquid metals such as Bi, In, Au, etc. It was found that the life of ion beam source could be improved by using the nitrides as a point ion beam source for these liquid metals.

TABLE 4

| Item | Materials | | | | | | |
|---|---|---|---|---|---|---|---|
| | W | TiN | ZrN | HfN | VN | NbN | TaN |
| Wettability (%) | 100 | 100 | 100 | 100 | 100 | 100 | 100 |
| Erosion | 10 | 0.6–0.8 | 0.3–0.5 | 0.2–0.3 | 0.7–1.0 | 0.5–0.7 | 0.3–0.4 |

EXAMPLE 3

The present example relates to point ion beam sources using diborides of metals of Groups IV and V.

Whiskers of $TiB_2$, $ZrB_2$, $HfB_2$, $VB_2$, $NbB_2$ and $TaB_2$ were made to grow by chemical vapor deposition. A quartz plate was placed as a substrate in an electric furnace kept at 1,000°–1,300° C., and any one of $TiCl_4$, $ZrCl_4$, $HfCl_4$, $VCl_5$, $NbCl_5$ and $TaCl_5$ together with a gas mixture of $BCl_3$ and $H_2$ was passed over the substrate for 2-5 hours to make the whisker to grow on it. To promote the growth of the whisker, Au and/or Ni powders were coated as a catalyst on the quartz plate. The resulting whiskers of all of the said species had the <100> orientation in the growth axial direction, and had dimensions of 50-100 μm in diameter and 0.5-5 mm long. The resulting whiskers were prepared into point ion beam sources in the same manner as in Example 1.

Table 5 shows comparison in life of these diboride tips when used as ion beam sources for various gas ion species. Table 6 shows the results of test thereof on wettability and erosion with Ga.

As is evident from Tables 5 and 6, the life can be improved by using the borides as tips for the point ion beam source.

TABLE 5

| ion species | Materials | | | | | | |
|---|---|---|---|---|---|---|---|
| | W | $TiB_2$ | $ZrB_2$ | $HfB_2$ | $VB_2$ | $NbB_2$ | $TaB_2$ |
| $H_2$ | 1.0 | 2.0-2.5 | 2.1-2.7 | 2.1-3.0 | 1.8-2.3 | 2.3-2.6 | 2.4-3.0 |
| Ne | 1.0 | 1.2-1.6 | 1.3-1.7 | 1.5-1.8 | 1.3-1.6 | 1.3-1.8 | 1.5-2.0 |
| $O_2$ | 1.0 | 1.1-1.5 | 1.3-1.6 | 1.5-1.7 | 1.3-1.6 | 1.4-1.7 | 1.6-1.9 |
| Ar | 1.0 | 1.2-1.8 | 1.5-2.0 | 1.5-2.0 | 1.3-1.9 | 1.6-2.2 | 1.5-2.5 |
| Kr | 1.0 | 2.0-3.0 | 2.2-3.3 | 2.6-3.6 | 2.0-2.5 | 2.6-3.2 | 2.7-3.7 |

TABLE 6

| Item | Materials | | | | | | |
|---|---|---|---|---|---|---|---|
| | W | $TiB_2$ | $ZrB_2$ | $HfB_2$ | $VB_2$ | $NbB_2$ | $TaB_2$ |
| Wettability (%) | 100 | 100 | 100 | 98 | 100 | 97 | 90 |
| Erosion | 1.0 | 0.5-0.6 | 0.3-0.5 | 0.2-0.3 | 0.5-0.6 | 0.2-0.3 | 0.1-0.2 |

EXAMPLE 4

The present example relates to point ion beam sources using hexaborides of rare earth metal elements.

Bar-like crystals of $LaB_6$, $CeB_6$, $PrB_6$, $NdB_6$, $SmB_6$ and $EuB_6$ were made to grow according to Al flux procedure using Al as a flux [Mat. Res. Bull. Vol. 14 (1979) p1329], and had dimensions of 0.1 mm in diameter and 2-3 mm long. The crystal orientation in the longitudinal direction was <100>. These bar-like crystals were bonded to carbon filaments in the same manner as in Example 1. The resulting hexaboride crystals were processed into needle-like forms by alternating current electropolishing in an aqueous 20 vol. % nitric acid solution as an electrolytic solution to prepare point ion beam sources.

Table 7 shows comparison in life of these hexaboride tips when used as ion beam sources for various gas ion species. Table 8 shows results of tests on wettability and erosion with Ga. As is evident therefrom, the hexaboride tips had a good wettability with Ga and a good erosion resistance. Similar tendency was observed only for Ga but also for In, Bi, Au, etc., but the erosion resistance was rapidly lowered at a tip temperature above 1,300° C. Thus, it was found that the hexaboride tips must be used at a temperature below 1,300° C.

TABLE 7

| Ion species | Materials | | | | | | |
|---|---|---|---|---|---|---|---|
| | W | $LaB_6$ | $CeB_6$ | $PrB_6$ | $NdB_6$ | $SmB_6$ | $EuB_6$ |
| $H_2$ | 1.0 | 1.2-2.0 | 1.2-1.8 | 1.2-1.8 | 1.1-1.6 | 1.0-1.5 | 1.0-1.5 |
| He | 1.0 | 1.2-1.5 | 1.2-1.5 | 1.1-1.4 | 1.1-1.4 | 1.0-1.2 | 1.0-1.1 |
| $O_2$ | 1.0 | 0.8 | 0.8 | 0.7-0.8 | 0.6-0.7 | 0.6-0.7 | 0.5 |
| Ar | 1.0 | 1.3-1.7 | 1.3-1.5 | 1.2-1.4 | 1.2-1.4 | 1.1 | 1.0 |
| Kr | 1.0 | 1.3-1.8 | 1.3-1.7 | 1.2-1.6 | 1.2-1.6 | 1.1-1.5 | 1.0-1.2 |

TABLE 8

| | Materials | | | | | | |
|---|---|---|---|---|---|---|---|
| | W | $LaB_6$ | $CeB_6$ | $PrB_6$ | $NdB_6$ | $SmB_6$ | $EuB_6$ |
| Wettability (%) | 100 | 100 | 100 | 100 | 100 | 98 | 90 |
| Erosion | 1.0 | 0.4-0.5 | 0.4-0.5 | 0.5-0.6 | 0.5-0.7 | 0.7-0.8 | 0.8-1.0 |

Among the various hexaborides, $LaB_6$ and $CeB_6$ are a little better as the ion beam source materials for gas and liquid metals, but even $EuB_6$ having the worst characteristics in the hexaborides is remarkably better as ion beam source material for the gas and liquid metal than the conventional W tip. It was found that these hexaboride materials can provide point ion beam sources of long life when used as the needle-like tips for the point ion beam source.

EXAMPLE 5

The present example relates to point ion beam sources using carbon materials.

Point ion beam sources using needle-like carbon tips were prepared in the same manner as in Example 1 from commercially available carbon fibers (8 μm in diameter) obtained by carbonizing polyacrylonitrile fibers with heating and glass carbon fibers obtained by carbonizing resin fibers synthesized from furfural and pyrrole. The carbon was processed into a needle-like form by firing portions of the carbon fibers in a flame or by electropolishing.

The thus prepared point ion beam sources using the said commercially available carbon fibers and glassy carbon fibers as materials for needle-like tips were used for $H_2$, He, Ne, Ar, Kr, Xe, etc. It was found that they had lives which were 1.5-3 times as long as that of the needle-like W tip, when used as ion beam sources for all of these gas ion species. Furthermore, it was found that the point ion beam sources using these carbon materials had lives which were 2-4 times as long as that of the point ion beam source having the W tip for relatively active gas ion species such as $H_2O$, $O_2$, $CH_4$, $N_2$, etc. Since the needle-like carbon tips had less erosion by the active gas ion species than the needle-like W tip, they were proved as suitable point ion beam sources for the active gas ion species.

Investigation of properties of the carbon tips as ion beam sources for liquid metal ion sources revealed that stable ion beams were difficult to obtain for Ga, In, Bi, Au, etc. because the carbon tips were hardly wettable with them, but a good wettability was obtained with the metals capable of forming a compound with carbon, for example, Fe, Ni, Co, etc. and stable ion beams could be obtained.

Data obtained by comparing the carbon tips with the W tip in the erosion by various liquid metal species and alloy species under the identical conditions are shown in Table 9, where the erosion is determined on the basis of the erosion of the W tip.

TABLE 9

| Materials | Liquid Metal | | | | | | | |
|---|---|---|---|---|---|---|---|---|
| | Ga | In | Bi | Au | Pb | Fe | Co | Ni |
| Tungsten | 1 | 1 | 1 | 1 | 1 | 1 | 1 | 1 |
| Carbon | 0.2–0.3 | 0.2–0.3 | 0.2–0.4 | 0.1–0.3 | 0.1–0.3 | 0.3–0.5 | 0.3–0.5 | 0.3–0.5 |
| Materials | Liquid alloy in atomic % | | | | | | | |
| | 55 Ni-45 B | 70 Pt-30 B | 50 Ni-20 Pt-30 B | 69 Au-31 Si | 81 Ni-19 P | 63 Ni-37 As | 72 Pt-28 As | 33 Au-67 Si |
| Tungsten | 1 | 1 | 1 | 1 | 1 | 1 | 1 | 1 |
| Carbon | 0.01–0.2 | 0.01–0.1 | 0.02–0.2 | 0.05–0.2 | 0.05–0.2 | 0.1–0.3 | 0.1–0.3 | 0.2–0.4 |

As is obvious from Table 9, the erosion can be reduced to less than one-half of the erosion of the W tip by using carbon as the material for ion beam source. The carbon materials have a remarkable significance in the erosion resistance particularly for the alloys containing B and P. That is, in the case of alloys containing B and P, the life of ion beam source can be considerably increased by using the carbon materials in an ion beam source. This tendency can be kept against a little change in the alloy composition.

The life of the point ion beam sources using the carbon materials depends upon the heating temperature of carbon tip to some extent, but when the carbon tips were made to work just above the melting points of the respective metals, it was found that their lives were at least twice as long as that of the W tip as made to work at the identical temperature for all the liquid metal and liquid alloy species.

As is evident from the foregoing examples, point ion beam sources using carbides, nitrides and diborides of the metals of groups IV and V, hexaborides of rare earth metal elements and carbon as needle-like tips have a longer life and higher brightness than the conventional point ion beam source using a needle-like W tip. This is also true of other conventional point ion beam sources using refractory metals other than W, that is, Mo, Ta, Nb, Ir, Re, Pt, etc. as needle-like tips. The above-mentioned compound tips and carbon tips of the present invention are more suitable for a point ion beam source than the single metal tips. Particularly, the carbon tips can produce a particularly better effect for the alloys containing metalloid and semiconductor elements.

Selection of the said compound tips and carbon tips of the present invention depends upon the desired kind of ion beam and the object of its application. For example, the ion beam emitted from a point ion beam source involves a very small amount of elements constituting the needle-like tip. In the selection of needle-like material, the said problem of contamination of other elements should be taken into account. That is, a nonobjectionable tip material should be selected even if contamination by its elements occurs. By providing point ion beam sources using these tips in ion beam-application apparatuses or systems, such as a microanalyzer, etc., their performance can be effectively and greatly improved.

In the foregoing examples, single application of whiskers of carbides, nitrides, and borides represented by MC, MN and $MB_2$ (M=Ti, Zr, Hf, V, Nb or Ta) as needle-like tips has been described, but mixtures thereof can produce the similar effect. That is, mixed crystals of TiC—ZrC, TiC—HfC, ZrN—HfN, VN—TaN, $TiB_2$—$HfB_2$, $ZrB_2$—$TaB_2$, TiC—ZrC—HfC, etc. have the similar effect. This is also true of the hexaborides of rare earth metal elements.

The features described in Examples 1–5 are specific of these tip materials, and any other initial forms of the materials than the whisker or bar-like crystal form are not objectionable. For example, point ion beam sources having similar features can be produced by carbidizing, nitridizing, or boridizing metallic needle-like tips of Ti, Zr, Hf, etc.

What is claimed is:

1. An ion beam source comprising an ionization chamber, a needle-like tip disposed in the ionization chamber, a support for the needle-like tip, a supply source for a substance to be ionized, and a cathode, the needle-like tip being comprised of a carbide, a nitride, or a diboride of at least one element selected from the group consisting of Ti, Zr, Hf, V, Nb and Ta, a hexaboride of at least one element of rare earth metal elements of atomic numbers 57–70, or carbon.

2. The ion beam source according to claim 1, wherein the substance to be ionized is at least one metallic element selected from the group consisting of Ga, In, Bi, Au, Pb, Fe, Co and Ni, or an alloy containing at least one metallic element selected from the group consisting of Ni, Pt and Au as a major component and at least one element selected from the group consisting of B, Si, P, As and Sb, and the supply source for the substance to be ionized is provided at a position near a joint part between the needle-like tip and the support for the tip.

3. The ion beam source according to claim 1, wherein the substance to be ionized is at least one gas species selected from the group consisting of $H_2$, He, Ne, Ar, Kr, Xe, $N_2$, $O_2$, $H_2O$, and $CH_4$, and the supply source for the substance to be ionized is an inlet for introducing the gas species into the ionization chamber.

4. The ion beam source according to any one of claims 1 to 3, wherein the needle-like tip is a single crystal whisker of the carbide having the <111> or <110> orientation.

5. The ion beam source according to any one of claims 1 to 3, wherein the needle-like tip is a single cyrstal whisker of the nitride having the <111> or <110> orientation.

6. The ion beam source according to any one of claims 1 to 3, wherein the needle-like tip is a single crystal whisker of the diboride having the <100> orientation.

7. The ion beam source according to any one of claims 1 to 3, wherein the needle-like tip is a single crystal of the hexaboride having the <100> orientation.

8. The ion beam source according to claim 7, wherein the hexaboride is a hexaboride of at least one element selected from the group consisting of La, Ce, Pr, Nd, Sm, and Eu.

9. The ion beam source according to claim 8, wherein said hexaboride is LaB$_6$ or CeB$_6$.

10. The ion beam source according to claim 9, wherein said hexaboride is CeB$_6$.

11. The ion beam source according to any one of claims 1 to 3, wherein the needle-like tip is comprised of carbon.

12. The ion beam source according to claim 11, wherein the carbon is glassy carbon.

13. The ion beam source according to claim 11, wherein the substance to be ionized is an alloy containing at least one metallic element selected from the group consisting of Ni, Pt and Au as a major component and at least one element selected from the group consisting of B and P, and the supply source for the substance to be ionized is provided at a position near a joint part between the needle-like tip and the support for the tip.

14. The ion beam source according to claim 1, wherein said needle-like tip is comprised of a carbide or a nitride of said at least one element, with the ratio of C or N to said at least one element being in a range of 0.5–2.

15. The ion beam source according to claim 14, wherein said ratio is substantially 1.0.

16. The ion beam source according to claim 1, further comprising means for applying a high potential between said needle-like tip and said cathode such that the needle-like tip takes a positive charge of a sufficient strength to ionize the substance to be ionized.

* * * * *